United States Patent
Akiyama

(10) Patent No.: US 11,412,193 B2
(45) Date of Patent: Aug. 9, 2022

(54) PROJECTOR

(71) Applicant: SEIKO EPSON CORPORATION, Tokyo (JP)

(72) Inventor: Koichi Akiyama, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/778,021

(22) Filed: Jan. 31, 2020

(65) Prior Publication Data

US 2020/0252589 A1    Aug. 6, 2020

(30) Foreign Application Priority Data

Feb. 1, 2019   (JP) ............................. JP2019-016837

(51) Int. Cl.
   *H04N 9/31*   (2006.01)
   *G03B 21/20*   (2006.01)
   *H01L 27/146*   (2006.01)

(52) U.S. Cl.
   CPC ....... *H04N 9/3155* (2013.01); *G03B 21/2033* (2013.01); *H01L 27/14627* (2013.01); *H04N 9/3108* (2013.01); *G03B 21/2066* (2013.01)

(58) Field of Classification Search
   CPC ............ G03B 21/00–64; G03B 21/204; H04N 9/31–3197; G02B 26/008
   See application file for complete search history.

(56) References Cited

U.S. PATENT DOCUMENTS

| | | |
|---|---|---|
| 5,161,042 A | 11/1992 | Hamada |
| 6,332,684 B1 * | 12/2001 | Shibatani ............. H04N 9/3108 348/E9.027 |
| 2002/0126390 A1 | 9/2002 | Matsushita et al. |
| 2005/0248736 A1 | 11/2005 | Itoh |
| 2013/0027670 A1 | 1/2013 | Akiyama et al. |
| 2013/0100417 A1 * | 4/2013 | Yang .................... G03B 21/204 353/31 |
| 2015/0098065 A1 * | 4/2015 | Tanaka ............... G03B 21/2073 353/84 |
| 2015/0109538 A1 * | 4/2015 | Otani ................... G02B 27/141 349/8 |

(Continued)

FOREIGN PATENT DOCUMENTS

| | | |
|---|---|---|
| JP | H04-060538 A | 2/1992 |
| JP | 2002-214405 A | 7/2002 |
| JP | 2005-321502 A | 11/2005 |

(Continued)

*Primary Examiner* — Michelle M Iacoletti
*Assistant Examiner* — Christopher A Lamb, II
(74) *Attorney, Agent, or Firm* — Dority & Manning, P.A.

(57) ABSTRACT

The present disclosure relates to a projector including a light source apparatus that outputs a light ray flux containing fluorescence, a bandpass filter provided at least in part of an optical path of the fluorescence, an integrator unit on which the light ray flux is incident and which divides the light ray flux into a plurality of partial light ray fluxes, a superimposing lens that is provided on the downstream of the integrator unit and causes the plurality of partial light ray fluxes to be incident in different positions, a light modulator including a plurality of pixels, a microlens array including a plurality of microlenses corresponding to the plurality of pixels, and a projection optical apparatus that projects light outputted from the light modulator.

16 Claims, 9 Drawing Sheets

(56) References Cited

U.S. PATENT DOCUMENTS

2017/0205696 A1* 7/2017 Kikuma .............. H04N 9/3158

FOREIGN PATENT DOCUMENTS

| JP | 2009-063892 A | 3/2009 |
| --- | --- | --- |
| JP | 2010-078900 A | 4/2010 |
| JP | 2013-029585 A | 2/2013 |
| JP | 2013-054091 A | 3/2013 |
| JP | 2013-167812 A | 8/2013 |
| JP | 2015-060035 A | 3/2015 |

* cited by examiner

PROJECTOR

The present application is based on, and claims priority from JP Application Serial Number 2019-016837, filed Feb. 1, 2019, the disclosure of which is hereby incorporated by reference herein in its entirety.

BACKGROUND

1. Technical Field

The present disclosure relates to a projector.

2. Related Art

There is a projector of related art in which three dichroic mirrors disposed at different angles are used to separate white light from a light source into R light, G light, and B light and cause the separated R light, G light, and B light to be incident on a single light modulator to produce image light (see JP-A-04-60538, for example).

In the projector described above, however, the R light, the G light, and the B light separated by the dichroic mirrors have different optical path lengths, and areas illuminated with the R light, the G light, and the B light have different sizes accordingly, resulting in a problem of a decrease in light use efficiency.

SUMMARY

According to an aspect of the present disclosure, there is provided a projector including a light source apparatus that outputs a light ray flux containing fluorescence, a bandpass filter provided at least in part of an optical path of the fluorescence, an integrator unit on which the light ray flux is incident and which divides the light ray flux into a plurality of light fluxes, a superimposing lens that is provided on a downstream of the integrator unit and causes the plurality of light fluxes to be incident in different positions, a light modulator including a plurality of pixels formed of a plurality of sub-pixels, a microlens array including a plurality of microlenses corresponding to the plurality of pixels, and a projection optical apparatus that projects light outputted from the light modulator.

In the aspect described above, the bandpass filter may be movable between a first position located in the optical path and a second position that does not overlap with the optical path.

In the aspect described above, the projector may further include a mover that moves the bandpass filter between the first position and the second position.

In the aspect described above, the mover may switch a position of the bandpass filter between the first position and the second position in accordance with an image display mode in accordance with which the projector projects an image.

In the aspect described above, the fluorescence may contain at least green light.

In the aspect described above, the fluorescence may contain the green light and yellow light, and the bandpass filter may be provided at least in an optical path of the yellow light.

In the aspect described above, the light source apparatus may include a parallelizing system that parallelizes the fluorescence, and that the fluorescence parallelized by the parallelizing system is incident on the bandpass filter.

DESCRIPTION OF EXEMPLARY EMBODIMENTS

Figure 1:
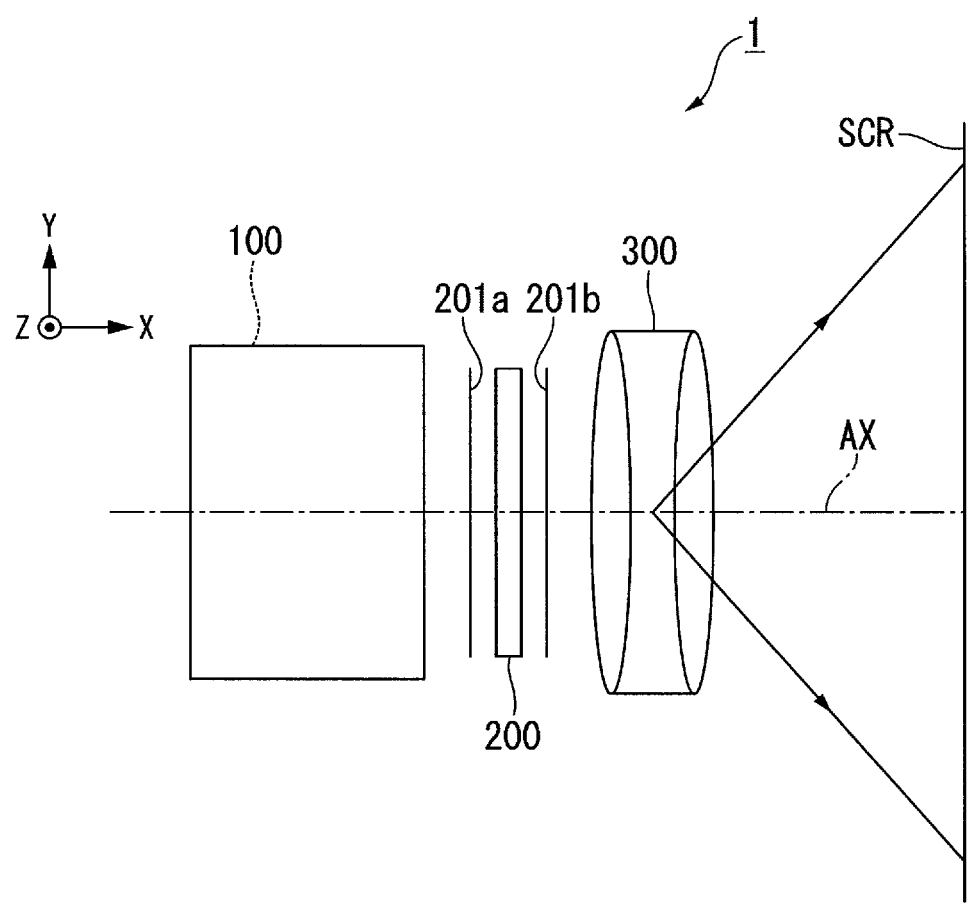
FIG. 1 is a plan view showing a schematic configuration of a projector according to an embodiment.

Embodiments of the present disclosure will be described below in detail with reference to the drawings.

In the drawings used in the following description, a characteristic portion is enlarged for convenience in some cases for clarity of the characteristic thereof, and the dimension ratio and other factors of each component are therefore not always equal to actual values.

First Embodiment

A projector according to the present embodiment is a projection-type image display apparatus that displays a color image on a screen. The projector according to the present embodiment uses a laser light source, such as a semiconductor laser that produces high-intensity, high-power light, as a light source of an illuminator.

FIG. 1 is a plan view showing a schematic configuration of the projector according to the present embodiment.

A projector 1 includes an illuminator 100, a light modulator 200, and a projection optical apparatus 300, as shown in FIG. 1. In the projector 1, an illumination optical axis of illumination light outputted from the illuminator 100 is called an optical axis AX. The following description will be made by using an XYZ orthogonal coordinate system as required. The axis Z is an axis extending in the upward/downward direction of the projector, the axis X is an axis parallel to the optical axis AX, and the axis Y is an axis perpendicular to the axes X and Z.

The light modulator 200 is, for example, a single-plate liquid crystal light modulator using a single color liquid crystal display panel. Employing such a single-plate liquid crystal light modulator allows reduction in size of the projector 1. The light modulator 200 modulates the illumination light from the illuminator 100 in accordance with image information to form image light.

A light-incident-side polarizer 201a is provided on a side of the light modulator 200 that is the side facing the illuminator 100. A light-exiting-side polarizer 201b is provided on a side of the light modulator 200 that is the side facing the projection optical apparatus 300. The light-incident-side polarizer 201a and the light-exiting-side polarizer 201b have polarization axes perpendicular to each other.

The projection optical apparatus 300 is formed of a projection lens, enlarges the image light modulated by the light modulator 200, and projects the enlarged image light toward a screen SCR. The number of lenses that form the projection optical apparatus may be one or more.

Illuminator

A specific configuration of the illuminator 100 will subsequently be described.

Figure 2:
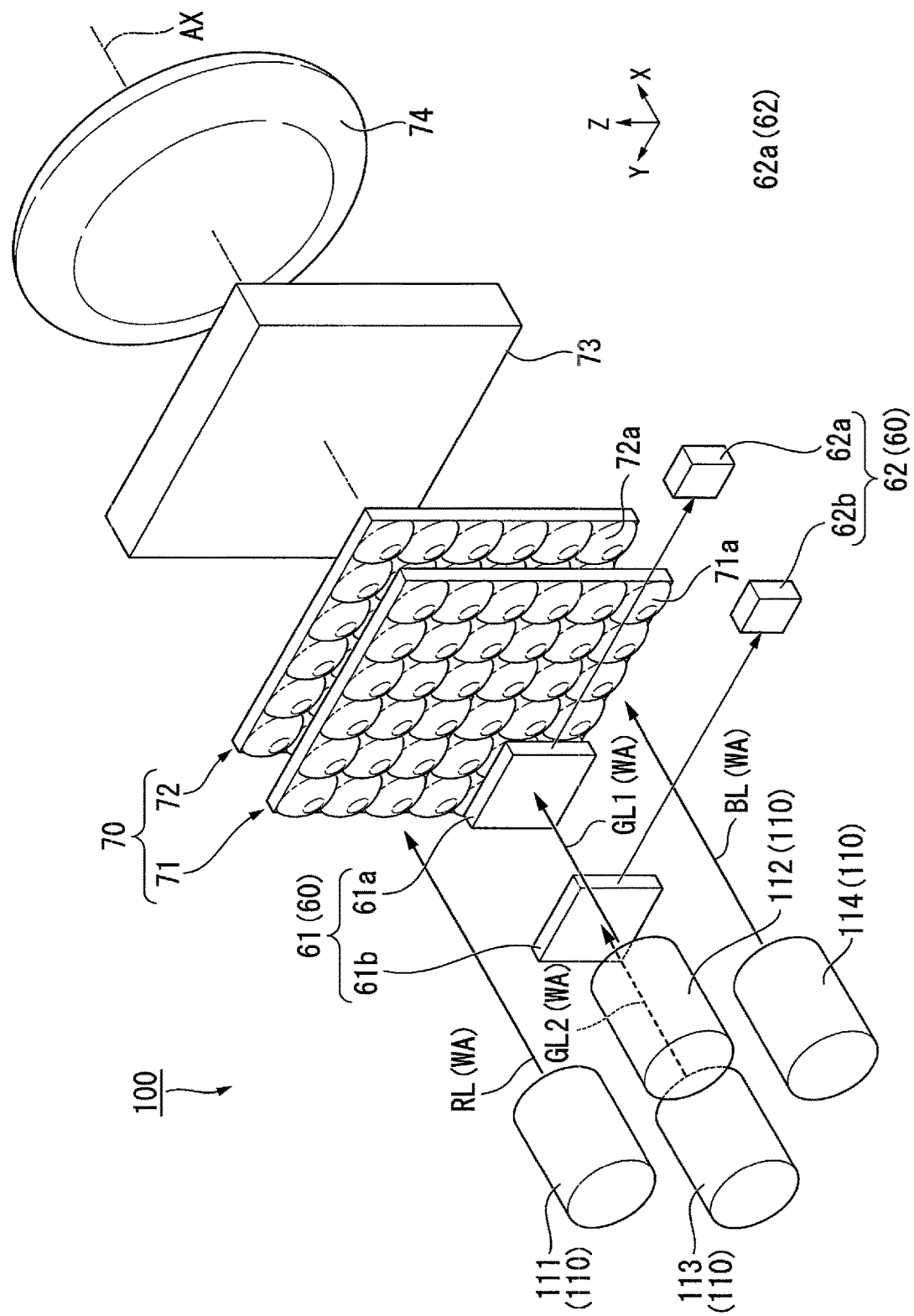
FIG. 2 is a perspective view showing a schematic configuration of an illuminator.

FIG. 2 is a perspective view showing a schematic configuration of the illuminator. The illuminator 100 includes a light source apparatus 110, a wavelength band converter 60, a lens integrator unit 70, a polarization converter 73, and a superimposing lens 74, as shown in FIG. 2.

The light source apparatus 110 includes a first light source unit 111, a second light source unit 112, a third light source unit 113, and a fourth light source unit 114. The first light source unit 111 and the second light source unit 112 are disposed in the same position in the direction along the axis Z. The third light source unit 113 and the fourth light source unit 114 are disposed in the same position in the direction along the axis Z. The first light source unit 111 is located above the third light source unit 113 in the direction along the axis Z. The second light source unit 112 is located above the fourth light source unit 114 in the direction along the axis Z. That is, the light source apparatus 110 has a two-tier structure.

Figure 3A:
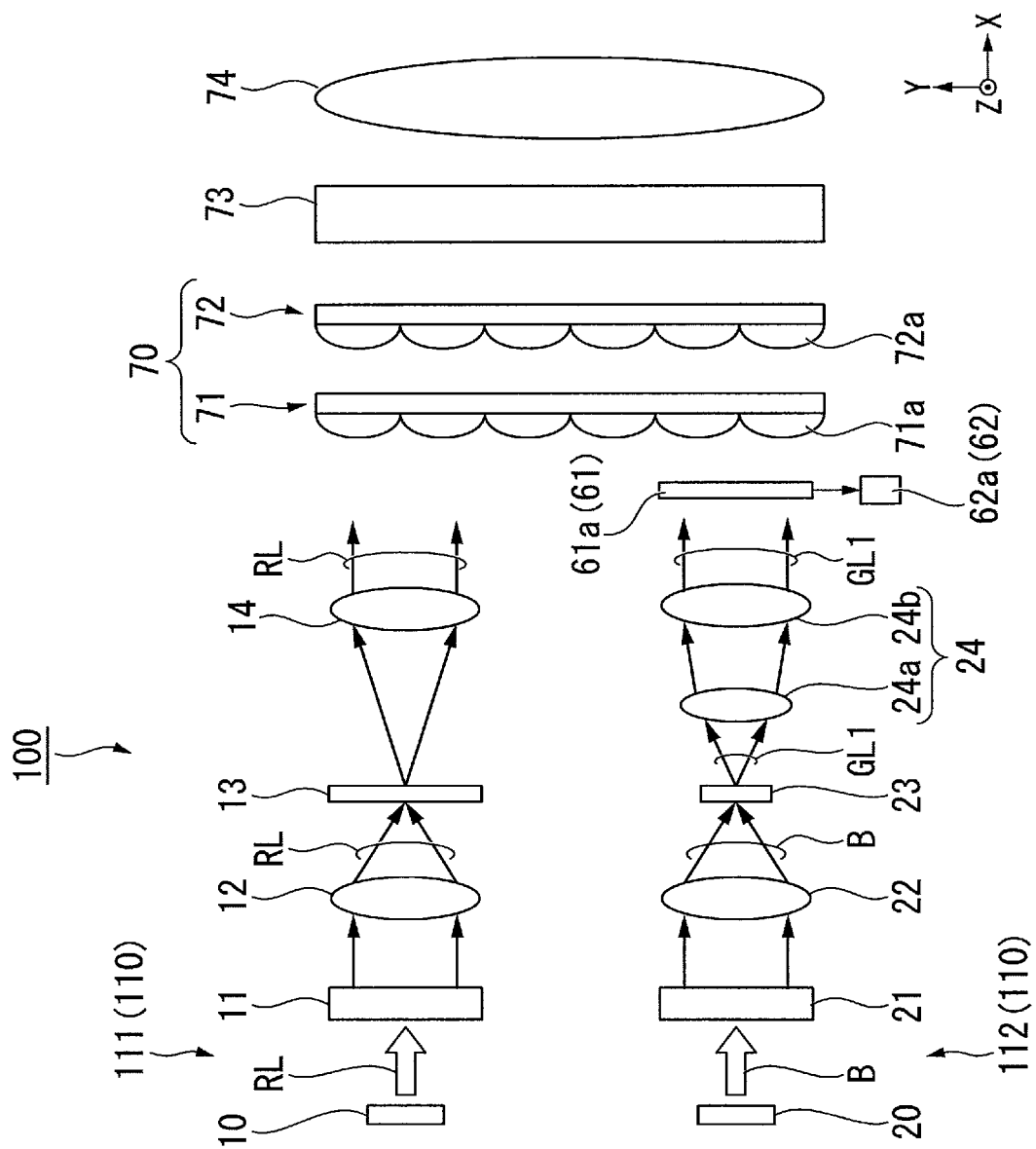
FIG. 3A shows the configuration of an upper tier of the illuminator.
Figure 3B:
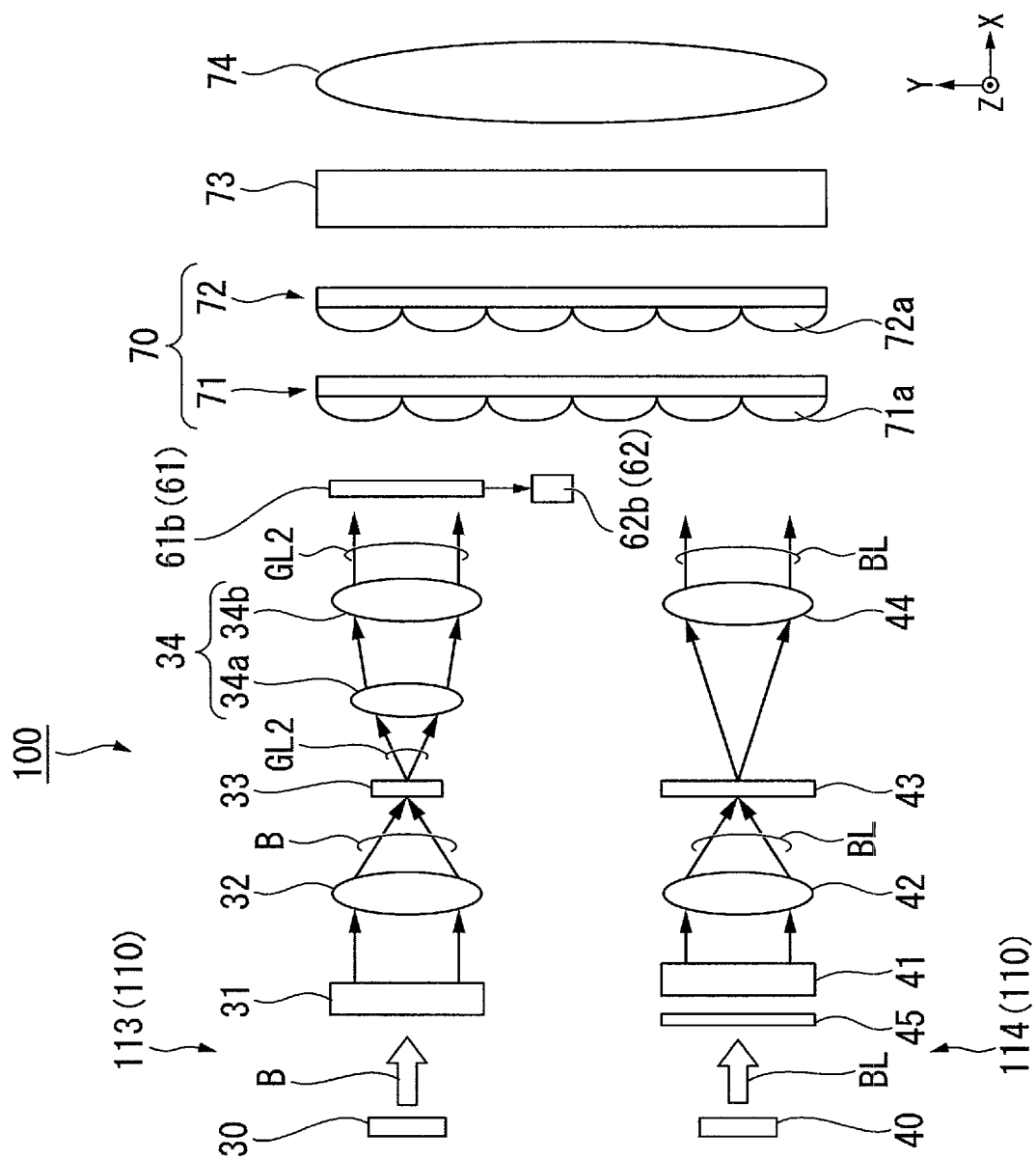
FIG. 3B shows the configuration of a lower tier of the illuminator.

FIG. 3A shows the configuration of the upper tier of the illuminator. FIG. 3B shows the configuration of the lower tier of the illuminator.

The first light source unit 111 includes a laser light source 10, a homogenizer 11, a light collection lens 12, a diffuser plate 13, and a pickup lens 14, as shown in FIG. 3A. The laser light source 10 includes a red semiconductor laser device that outputs red light RL as a laser beam, for example, having a peak wavelength of 635 nm±20 nm and a collimation lens that parallelizes the red light RL outputted from the red semiconductor laser device. The red light RL outputted from the laser light source 10 is polarized light (light polarized in parallel to axis Z, for example) that passes through the light-incident-side polarizer 201a provided on the light incident side of the light modulator 200 shown in FIG. 1.

The homogenizer 11 is formed of a pair of multi-lens arrays and homogenizes the illuminance distribution of the red light RL. The light collection lens 12 collects the red light RL having passed through the homogenizer 11 and causes the collected red light RL to be incident on the diffuser plate 13. The diffuser plate 13 diffuses the red light RL to further homogenize the intensity distribution thereof. The diffuser plate 13 can be a known diffuser plate, for example, a ground glass plate, a holographic diffuser, a transparent substrate having a blasted surface, or a transparent substrate having scatterers, such as beads, dispersed therein to allow the scatterers to scatter light.

The pickup lens 14 parallelizes the red light RL diffused by the diffuser plate 13. The pickup lens 14 is formed of a single lens. The pickup lens 14 may instead be formed of a plurality of lenses.

As described above, the first light source unit 111 is configured to output the red light RL formed of a laser beam toward the lens integrator unit 70.

The second light source unit 112 includes an excitation light source 20, a homogenizer 21, a light collection lens 22, a phosphor layer 23, and a pickup system 24. The excitation light source 20 excites the phosphor layer 23 to produce fluorescence. The excitation light source 20 includes a laser beam emitting device that outputs a blue laser beam, for example, having a peak wavelength ranging from 440 to 470 nm as excitation light B and a collimation lens that parallelizes the excitation light B outputted from the laser beam emitting device. The excitation light source 20 may instead be formed of a plurality of blue laser beam emitting devices in accordance with the required power of the excitation light B.

The homogenizer 21 is formed of a pair of multi-lens arrays and homogenizes the illuminance distribution of the excitation light B. The light collection lens 22 collects the excitation light B having passed through the homogenizer 21 and causes the collected excitation light B to be incident on the phosphor layer 23.

The phosphor layer 23 contains a phosphor that absorbs the excitation light B and is excited thereby. The phosphor excited by the excitation light B emits first green light (fluorescence) GL1, for example, having a peak wavelength ranging from 500 to 600 nm. The phosphor layer 23 outputs the first green light GL1 via a side of the phosphor layer 23 that is the side opposite the side on which the excitation light B is incident. The first green light GL1 emitted from the phosphor layer 23 enters the pickup system (parallelizing system) 24. The pickup system 24, which includes two convex lenses 24a and 24b, can satisfactorily pick up and parallelize the first green light GL1 radiated at a large angle.

The second light source unit 112 thus outputs the first green light GL1, which is fluorescence, toward the lens integrator unit 70.

The third light source unit 113 has the same configuration as that of the second light source unit 112, as shown in FIG. 3B. That is, the third light source unit 113 includes an excitation light source 30, a homogenizer 31, a light collection lens 32, a phosphor layer 33, and a pickup system 34 and outputs the second green light (fluorescence) GL2 toward the lens integrator unit 70.

It is conceivable that the first green light GL1 and the second green light GL2 are each produced in the form of a laser beam, but a green laser beam emitting device has poor light emission efficiency and is also expensive. In contrast, the light source apparatus 110 in the present embodiment produces the first green light GL1 and the second green light GL2 by using fluorescence, whereby bright green light can be produced at low cost.

The fourth light source unit 114 includes a laser light source 40, a retardation film 45, a homogenizer 41, a light collection lens 42, a diffuser plate 43, and a pickup lens 44. The laser light source 40 includes a blue semiconductor laser device that outputs blue light BL as a laser beam, for example, having a peak wavelength of 455 nm±20 nm and a collimation lens that parallelizes the blue light BL outputted from the blue semiconductor laser device.

In the present embodiment, the first light source unit 111 and the fourth light source unit 114 are so disposed that the red semiconductor laser device in the laser light source 10 and the blue semiconductor laser device in the laser light source 40 have the same orientation.

The red semiconductor laser device and the blue semiconductor laser device, however, output linearly polarized beams polarized in different directions due to the difference in oscillation mode. The blue light BL outputted from the laser light source 40 is therefore polarized in parallel to the axis Y and therefore unable to pass through the light-incident-side polarizer 201a provided on the light incident side of the light modulator 200.

In view of the fact described above, the fourth light source unit 114 includes the retardation film 45 disposed between the laser light source 40 and the homogenizer 41. The retardation film 45 is a half-wave plate. The blue light BL incident on the retardation film 45 is converted from the light polarized in parallel to the axis Y into light polarized in parallel to the axis Z. The blue light BL can thus pass through the light-incident-side polarizer 201a provided on the light incident side of the light modulator 200.

The homogenizer 41 is formed of a pair of multi-lens arrays and homogenizes the illuminance distribution of the blue light BL. The light collection lens 42 collects the blue light BL having passed through the homogenizer 41 and causes the collected blue light BL to be incident on the diffuser plate 43. The diffuser plate 43 diffuses the blue light BL to further homogenize the intensity distribution thereof. The diffuser plate 43 can be identical to the diffuser plate 13 described above.

The pickup lens 44 parallelizes the blue light BL diffused by the diffuser plate 43. The pickup lens 44 is formed of a single lens. The pickup lens 44 may instead be formed of a plurality of lenses.

The fourth light source unit 114 thus outputs the blue light BL, which is formed of a laser beam, toward the lens integrator unit 70.

The light source apparatus 110 in the present embodiment thus outputs a light ray flux WA containing the red light RL, the first green light GL1, the second green light GL2, and the blue light BL toward the lens integrator unit 70. In the present embodiment, the center axis of the light ray flux WA outputted from the light source apparatus 110 coincides with the optical axis AX. The chief rays of the color light fluxes, RL, GL1, GL2, and BL are separate from the center axis of the light ray flux WA (optical axis AX) by the same distance.

The projector 1 according to the present embodiment can adjust the quality of an image projected on the screen SCR in accordance with an image display mode. Specifically, the projector 1 according to the present embodiment includes the wavelength band converter 60 as an image quality adjuster.

The wavelength band converter 60 moves a bandpass filter 61 in accordance with the image display mode of the projector 1 to adjust the quality of an image projected on the screen SCR. The configuration of the wavelength band converter 60 will be described below.

The wavelength band converter 60 includes the bandpass filter 61 and a mover 62, which moves the bandpass filter 61. The bandpass filter 61 is provided in the optical path of the fluorescence (first green light GL1 and second green light GL2). The bandpass filter 61 includes a first bandpass filter 61a and a second bandpass filter 61b in the present embodiment.

The first bandpass filter 61a is disposed in the optical path of the first green light GL1, and the second bandpass filter 61b is disposed in the optical path of the second green light GL2. The mover 62 includes a first mover 62a, which moves the first bandpass filter 61a, and a second mover 62b, which moves the second bandpass filter 61b. The first mover 62a and the second mover 62b are each formed, for example, of an actuator. The wavelength band converter 60 in the present embodiment controls the operation of driving the first mover 62a and the second mover 62b based, for example, on a signal inputted from the projector 1 in accordance with the image display mode.

The first mover 62a moves the first bandpass filter 61a between a first position and a second position.

When located in the first position, the first bandpass filter 61a is disposed in the optical path of the first green light GL1. FIG. 2 shows the state in which the first bandpass filter 61a is disposed in the optical path of the first green light GL1.

The first bandpass filter 61a disposed in the optical path of the first green light GL1 is, specifically, disposed in the vicinity of the area on the downstream of the pickup system 24, which picks up and parallelizes the first green light GL1. That is, the first bandpass filter 61a is provided in the optical path of the first green light GL1 parallelized by the pickup system 24. The first green light GL1 parallelized by the pickup system 24 is thus incident on the first bandpass filter 61a.

Design of a film of a bandpass filter typically changes in accordance with the characteristics of light incident on the bandpass filter. For example, a film of a bandpass filter that receives parallelized light can be relatively readily designed.

In the projector 1 according to the present embodiment, in which the first green light GL1 is incident as parallelized light on the first bandpass filter 61a, the film of the first bandpass filter 61a is readily designed, whereby an inexpensive filter can be employed as the first bandpass filter 61a.

The first bandpass filter 61a disposed in the second position is out of the optical path of the first green light GL1. The first mover 62a moves the first bandpass filter 61a by gripping a frame member that holds the circumference of the first bandpass filter 61a.

The second mover 62b moves the second bandpass filter 61b between the first position and the second position. When located in the first position, the second bandpass filter 61b is disposed in the optical path of the second green light GL2. FIG. 2 shows the state in which the second bandpass filter 61b is disposed in the optical path of the second green light GL2.

The second bandpass filter 61b disposed in the second position is out of the optical path of the second green light GL2. The second mover 62b moves the second bandpass filter 61b by gripping a frame member that holds the circumference of the second bandpass filter 61b.

The first green light GL1 and the second green light GL2 belong to the same wavelength band. In the following description, when the first green light GL1 and the second green light GL2 are not distinguished from each other, they are simply called green light GL.

Figure 4:
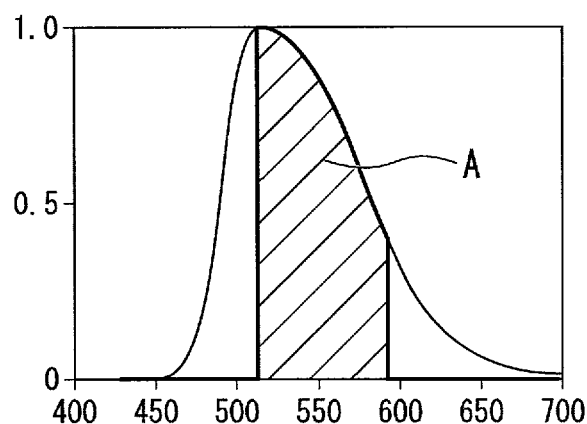
FIG. 4 shows the wavelength distribution of green light.

FIG. 4 shows the wavelength distribution of the green light. In FIG. 4, the horizontal axis represents the wavelength, and the vertical axis represents the brightness (normalized value) of the green light GL.

The green light GL, which is formed of fluorescence, has a wide wavelength band as compared with a green laser beam, as shown in FIG. 4. The color purity of the green light GL, which is formed of fluorescence, is therefore lower than that of a green laser beam.

The bandpass filter 61 selectively transmits light which belongs to a predetermined band (wavelength region from 520 to 590 nm, for example) indicated by the reference character A out of the wavelength band contained in the green light GL and absorbs the components that belong to the other wavelength region. The color purity of the green light GL having passed through the bandpass filter 61 is therefore improved as compared with the green light GL before passing through the bandpass filter 61. The brightness of the green light GL decreases after passing through the bandpass filter 61.

The wavelength band converter 60 can produce high-color-purity green light GL although the brightness of the green light GL lowers by placing the bandpass filter 61 in the optical path of the green light GL. Increasing the color purity of the green light GL leads to improvement in the color gamut of a displayed image.

On the other hand, the wavelength band converter 60 can produce bright green light GL although the color purity of the green light GL decreases by retracting the bandpass filter 61 from the optical path of the green light GL.

Therefore, in the projector 1 according to the present embodiment, the wavelength band converter 60 switches the position of the bandpass filter 61 to the first position located in the optical path of the green light GL to allow the light ray flux WA outputted from the light source apparatus 110 to enter the lens integrator unit 70 with the color purity of the green light GL contained in the light ray flux WA improved.

Further, in the projector 1 according to the present embodiment, the wavelength band converter 60 switches the position of the bandpass filter 61 to the second position, to which the bandpass filter 61 is retracted from the optical path of the green light GL, to allow the light ray flux WA outputted from the light source apparatus 110 to enter the lens integrator unit 70 with the brightness of the green light GL contained in the light ray flux WA maintained.

The lens integrator unit 70 includes a first lens array 71 and a second lens array 72. The first lens array 71 is formed, for example, of a plurality of first lenslets 71a arranged in a plane. The first lens array 71, specifically, the first lenslets 71a divide the light ray flux WA outputted from the light source unit 111 into a plurality of partial light ray fluxes and causes each of the partial light ray fluxes to converge.

The second lens array 72 includes, for example, a plurality of second lenslets 72a arranged in a plane in correspondence with the first lenslets 71a of the first lens array 71. In the present embodiment, the second lens array 72 along with the superimposing lens 74, which will be described later, superimposes images of the first lenslets 71a of the first lens array 71 on one another and causes the superimposed images to be incident on the light modulator 200.

The polarization converter 73 is formed of polarization separation films and retardation films (half-wave plates) arranged in an array. The polarization converter 73 converts the light from the lens integrator unit into light polarized in parallel to the axis Z. The polarization direction of the light to be incident on the light modulator 200 therefore coincides with the direction of the transmission axis of the light-incident-side polarizer 201a disposed on the light incident side of the light modulator 200. The light-incident-side polarizer 201a therefore does not block the light to be incident on the light modulator 200, whereby the light use efficiency is improved.

The superimposing lens 74 is formed, for example, of a convex lens, superimposes the light fluxes having passed through the lens integrator unit 70 and the polarization converter 73 on one another, and causes the resultant light to be incident on the light modulator 200.

In the present embodiment, the color light fluxes RL, GL1, GL2, and BL in the light ray flux WA do not overlap with each other. The color light fluxes RL, GL1, GL2, and BL are therefore incident on different areas of the lens integrator unit 70. The color light fluxes RL, GL1, GL2, and BL having passed through the lens integrator unit 70 and the polarization converter 73 enter the superimposing lens 74 with the non-overlap state still maintained.

In the following description, the light ray flux WA having passed through the lens integrator unit 70 and the polarization converter 73 is referred to as illumination light W. The illumination light W contains red illumination light WR, first green illumination light WG1, second green illumination light WG2, and blue illumination light WB. The red illumination light WR corresponds to the red light RL described above having traveled through the lens integrator unit 70 and the polarization converter 73. The first green illumination light WG1 corresponds to the first green light GL1 described above having traveled through the lens integrator unit 70 and the polarization converter 73. The second green illumination light WG2 corresponds to the second green light GL2 described above having traveled through the lens integrator unit 70 and the polarization converter 73. The blue illumination light WB corresponds to the blue light BL described above having traveled through the lens integrator unit 70 and the polarization converter 73.

Figure 5:
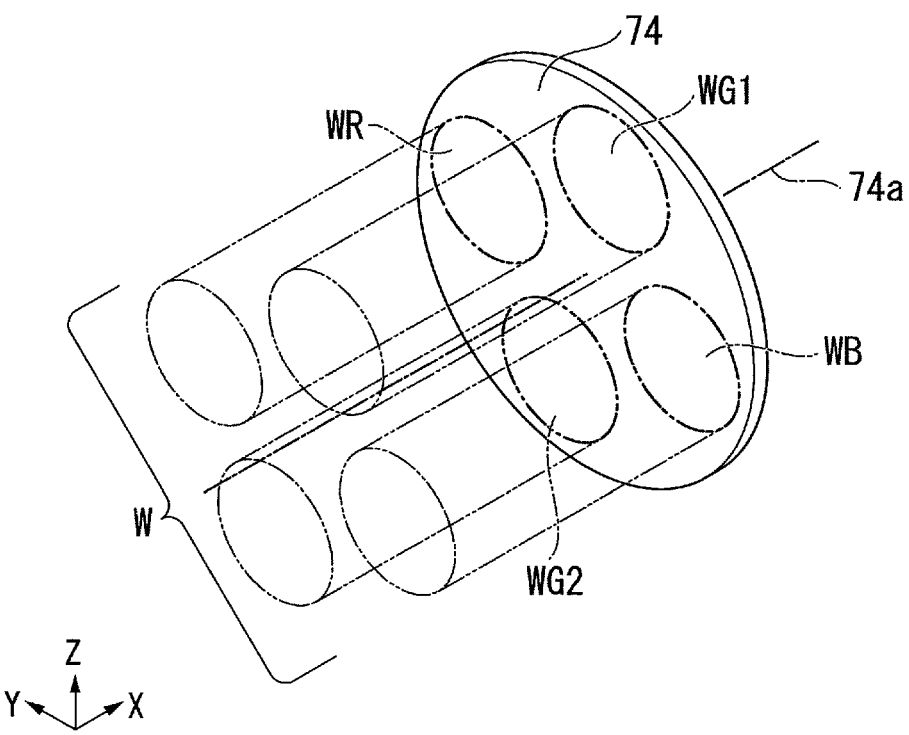
FIG. 5 is a perspective view showing the state of the light incident surface of a superimposing lens.

FIG. 5 is a perspective view showing the state of the light incident surface of the superimposing lens 74. FIG. 5 diagrammatically shows the red illumination light WR, the first green illumination light WG1, the second green illumination light WG2, and the blue illumination light WB.

Also in the illumination light W, the red illumination light WR, the first green illumination light WG1, the second green illumination light WG2, and the blue illumination light WB do not overlap with each other. The red illumination light WR, the first green illumination light WG1, the second green illumination light WG2, and the blue illumination light WB are therefore incident on different areas of the superimposing lens 74, as shown in FIG. 5. The chief rays of the red illumination light WR, the first green illumination light WG1, the second green illumination light WG2, and the blue illumination light WB are separate from a lens optical axis 74a of the superimposing lens 74 by the same distance. In a case where the red illumination light WR, the first green illumination light WG1, the second green illumination light WG2, and the blue illumination light WB are not particularly distinguished from one another, they are hereinafter collectively referred to as illumination light fluxes WR, WG1, WG2, and WB in some cases.

In the present embodiment, the superimposing lens 74 causes the directions in which the illumination light fluxes WR, WG1, WG2, and WB are incident on the light modulator 200 to differ from one another in accordance with the positions where the illumination light fluxes WR, WG1, WG2, and WB are incident on the superimposing lens 74. That is, the superimposing lens 74 allows the illumination light fluxes WR, WG1, WG2, and WB to be incident on the light modulator 200 in four directions.

Figure 6:
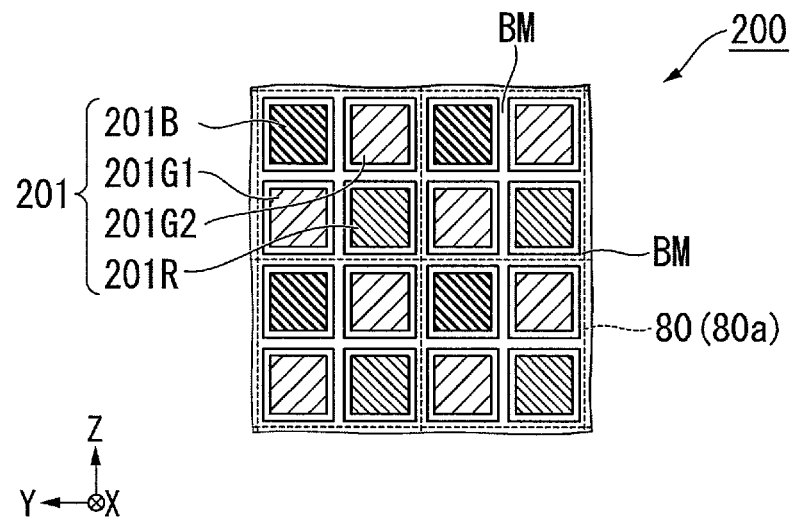
FIG. 6 is a plan view showing the structure of pixels of a light modulator.

The structure of pixels of the light modulator 200 will subsequently be described. FIG. 6 is a plan view showing the structure of the pixels of the light modulator 200.

The light modulator 200 includes a plurality of pixels 201, as shown in FIG. 6. The pixels 201 are formed of first sub-pixels 201R, second sub-pixels 201G1, third sub-pixels 201G2, and fourth sub-pixels 201B. The first sub-pixels 201R, the second sub-pixels 201G1, the third sub-pixels 201G2, and the fourth sub-pixels 201B are hereinafter abbreviated simply to sub-pixels 201R, 201G1, 201G2, and 201B in some cases.

In the light modulator 200 in the present embodiment, the plurality of pixels 201 are arranged in a matrix along the directions Y and Z. The pixels 201 are so arranged that the first sub-pixels 201R and the second sub-pixels 201G1 are arranged in this order in the direction +Y, that the third sub-pixels 201G2 are arranged in the direction +Z with respect to the first sub-pixels 201R, and that the fourth sub-pixels 201B are arranged in the direction +Z with respect to the second sub-pixels 201G1. The sub-pixels 201R, 201G1, 201G2, and 201B are separated from each other by a black matrix BM. In the present embodiment, the pixels 201 are optically conjugate with the light exiting surface of the second lens array 72.

In the present embodiment, the sub-pixels 201R, 201G1, 201G2, and 201B each have a substantially square shape, and the pixels 201 have as a whole a substantially square shape. The pixels 201 therefore each provide uniform luminance, whereby the light modulator 200 can produce unevenness-free, good-quality image light.

As described above, the projector 1 according to the present embodiment, in which the illumination light fluxes WR, WG1, WG2, and WB are incident on the superimposing lens 74 in different positions, allows the illumination light fluxes WR, WG1, WG2, and WB to be incident on a microlens array 80 provided on the light incident side of the light modulator 200 in four directions.

Figure 7:
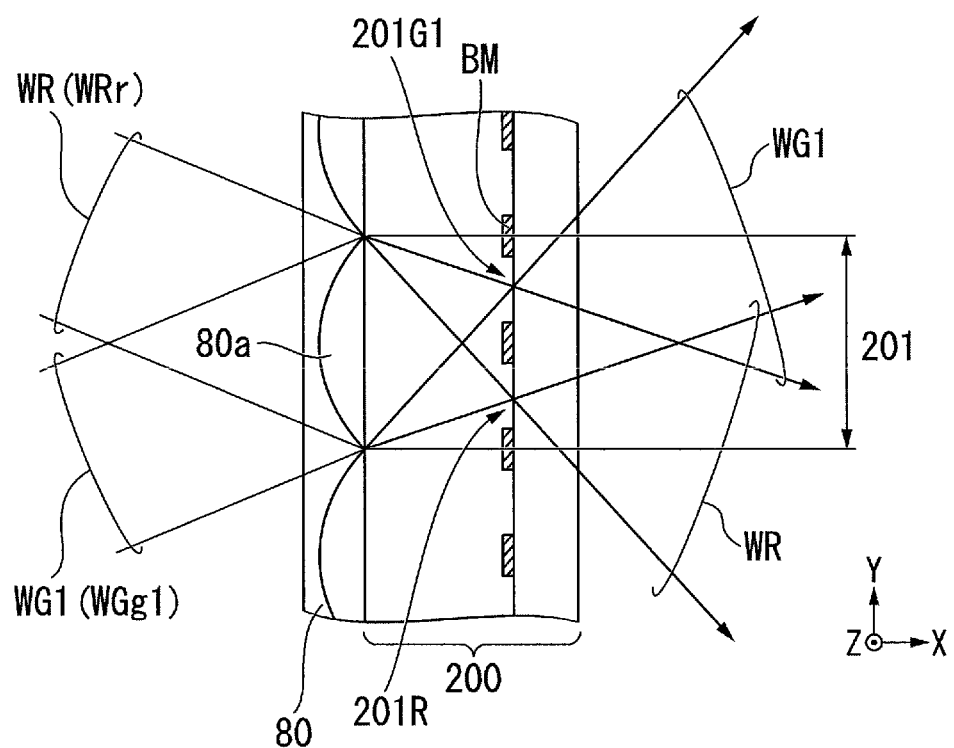
FIG. 7 shows a cross section of first and second sub-pixels.
Figure 8:
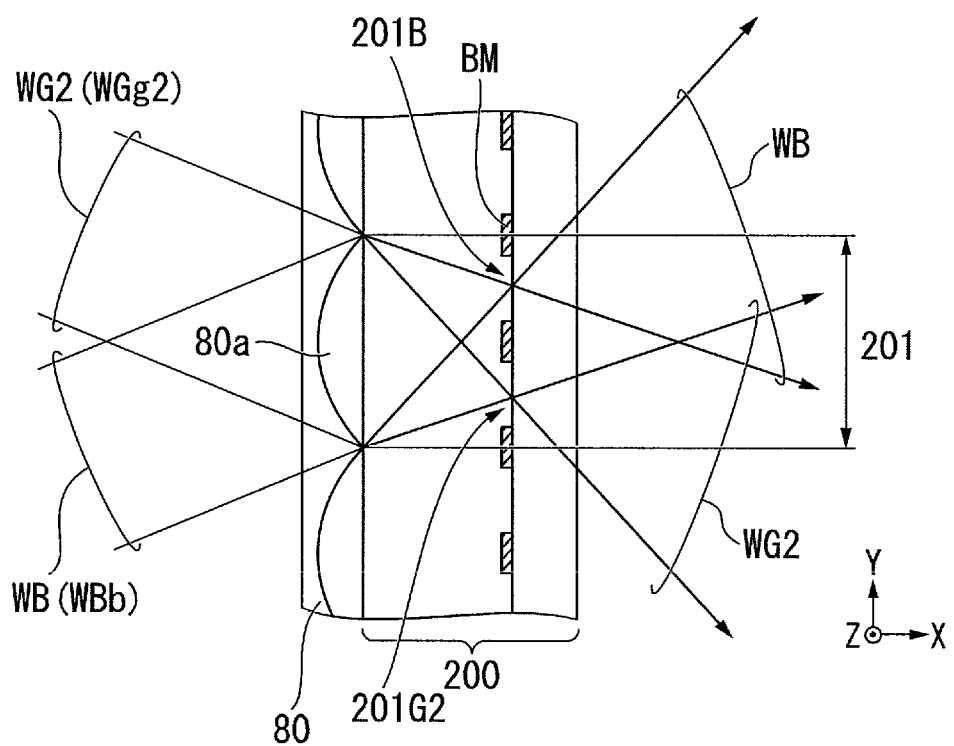
FIG. 8 shows a cross section of third and fourth sub-pixels.

FIG. 7 shows a cross section of the first and second sub-pixels. FIG. 8 shows a cross section of the third and fourth sub-pixels.

The microlens array 80 is integrally provided on the light-incident-side surface of the light modulator 200 as part thereof in the present embodiment, as shown in FIGS. 7 and 8. The microlens array 80 may instead be a component different from the light modulator 200.

The microlens array 80 includes a plurality of microlenses 80a and forms a plurality of partial light fluxes from the light incident on the microlens array 80.

Specifically, the red illumination light WR incident on the microlens array 80 is divided by the plurality of microlenses 80a into a plurality of partial light fluxes WRr. The first green illumination light WG1 incident on the microlens array 80 is divided by the plurality of microlenses 80a into a plurality of partial light fluxes WGg1.

The second green illumination light WG2 incident on the microlens array 80 is divided by the plurality of microlenses 80a into a plurality of partial light fluxes WGg2. The blue illumination light WB incident on the microlens array 80 is divided by the plurality of microlenses 80a into a plurality of partial light fluxes WBb.

The microlenses 80a are disposed in correspondence with the pixels 201 of the light modulator 200 in the one-to-one relationship. The first sub-pixels 201R correspond to the red illumination light WR out of the illumination light W incident on the light modulator 200. That is, the red illumination light WR incident on the microlens array 80 obliquely from above is divided into the partial light fluxes WRr, which are incident on the fourth sub-pixels 201B.

The second sub-pixels 201G1 correspond to the first green illumination light WG1. That is, the first green illumination light WG1 incident on the microlens array 80 obliquely from above is divided into the partial light fluxes WGg1, which are incident on the second sub-pixels 201G1.

The third sub-pixels 201G2 correspond to the second green illumination light WG2. That is, the second green illumination light WG2 incident on the microlens array 80 obliquely from below is divided into the partial light fluxes WGg2, which are incident on the third sub-pixels 201G2.

The fourth sub-pixels 201B correspond to the blue illumination light WB. That is, the blue illumination light WB incident on the microlens array 80 obliquely from below is divided into the partial light fluxes WBb, which are incident on the fourth sub-pixels 201B.

The projector 1 according to the present embodiment causes no difference in optical path length among the color light fluxes and in turn no difference in size of the illuminated area among the colors, unlike when a plurality of dichroic mirrors are used to adjust the directions in which the color light fluxes are incident on the sub-pixels of the light modulator 200, as in the related art. The projector 1 according to the present embodiment therefore causes no difference in optical path length among the separated illumination light fluxes WR, WG1, WG2, and WB achieved by the configuration in which the light fluxes are incident on the superimposing lens 74 in different positions and therefore causes no difference in size among the areas illuminated with the illumination light fluxes WR, WG1, WG2, and WB. The illumination light fluxes WR, WG1, WG2, and WB are therefore efficiently incident on the light modulator 200, whereby a decrease in the light use efficiency of the illuminator 100 can be avoided.

Further, the projector 1 according to the present embodiment, in which the wavelength band converter 60 places the bandpass filter 61 in the optical paths of the first green light GL1 and the second green light GL2, allows improvement in the color purity of the first green light GL1 and the second green light GL2 contained in the illumination light W. The projector 1 according to the present embodiment can therefore display an image in an image display mode that allows improvement in the color gamut of the displayed image (color gamut priority image display mode).

Further, the projector 1 according to the present embodiment, in which the wavelength band converter 60 retracts the bandpass filter 61 from the optical paths of the first green light GL1 and the second green light GL2, allows use of the first green illumination light WG1 and the second green illumination light WG2 contained in the illumination light W with no loss. The projector 1 according to the present embodiment can therefore display an image in an image display mode in which priority is given to the brightness of the displayed image instead of the color gamut thereof (brightness priority image display mode).

The projector 1 according to the present embodiment, in which the wavelength band converter 60 moves the position of the bandpass filter 61, can therefore switch the image display operation between the image display operation in the color gamut priority image display mode and the image display operation in the brightness priority image display mode.

Second Embodiment

An illuminator according to a second embodiment will subsequently be described. The present embodiment differs from the first embodiment in terms of the light ray flux outputted from the light source apparatus and the configuration of the wavelength band converter and is the same as the first embodiment in terms of the other points. Therefore, in the following description, the configurations common to those in the first embodiment have the same reference characters and will not be described in detail.

Figure 9:
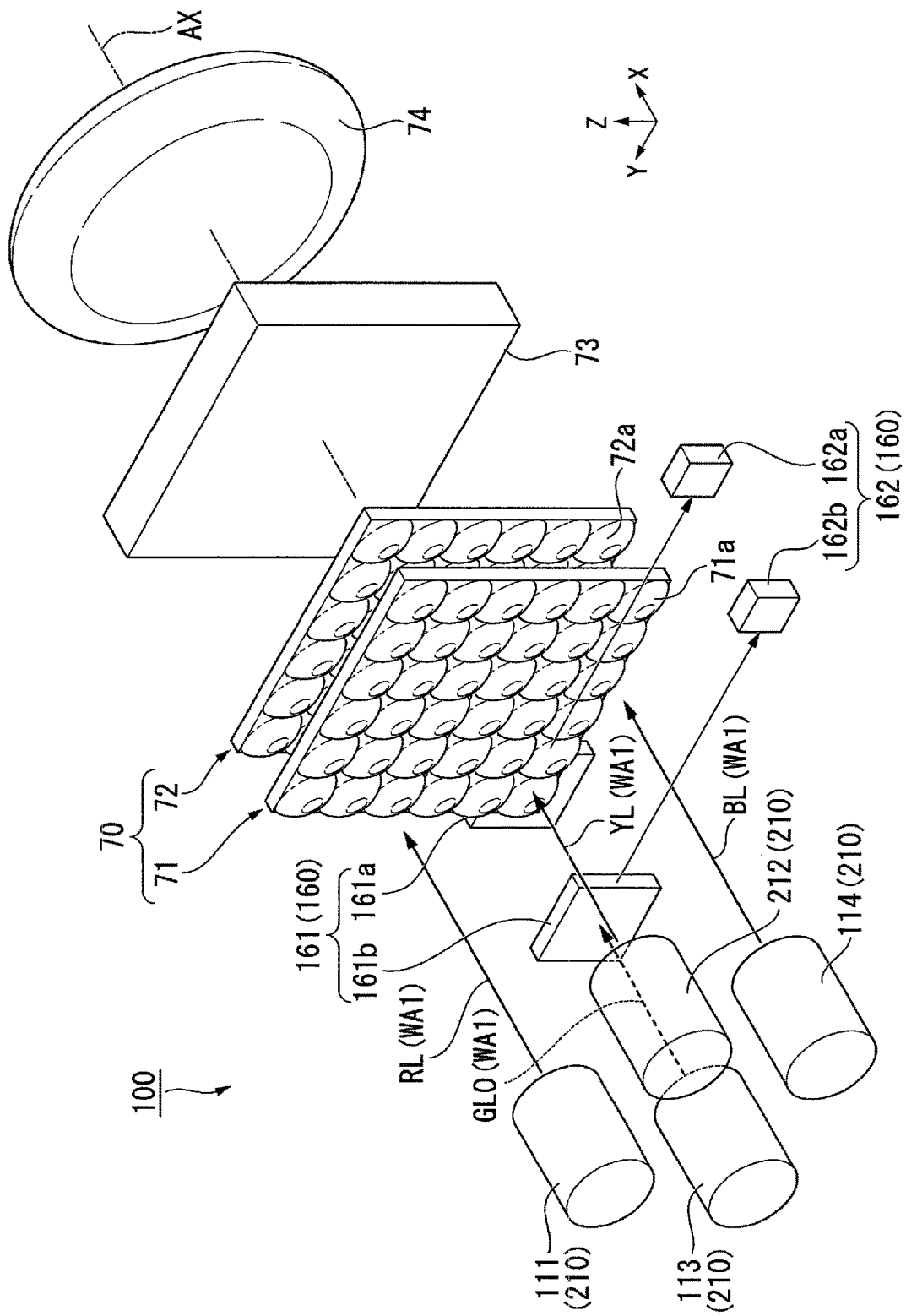
FIG. 9 is a perspective view showing a schematic configuration of an illuminator according to a second embodiment.

FIG. 9 is a perspective view showing a schematic configuration of the illuminator according to the present embodiment. An illuminator 100A includes a light source apparatus 210, a wavelength band converter 160, the lens integrator unit 70, the polarization converter 73, and the superimposing lens 74, as shown in FIG. 9.

The light source apparatus 210 in the present embodiment includes the first light source unit 111, a second light source unit 212, the third light source unit 113, and the fourth light source unit 114.

The second light source unit 212 outputs yellow light (fluorescence) YL, for example, having a peak wavelength ranging from 520 to 620 nm toward the lens integrator unit 70. The configuration of the second light source unit 212 is the same as that of the second light source unit 112 in the first embodiment except the type of the phosphor layer and will therefore not be described.

In the present embodiment, the first light source unit 111 outputs the red light RL, the third light source unit 113 outputs green light (fluorescence) GL0, and the fourth light source unit 114 outputs the blue light BL. The green light GL0 is formed of the second green light GL2 in the first embodiment.

The wavelength band converter 160 in the present embodiment includes a bandpass filter 161 and a mover 162, which moves the bandpass filter 161. The bandpass filter 161 is provided in the optical path of the fluorescence (yellow light YL and green light GL0). In the present embodiment, the bandpass filter 161 includes a first bandpass filter 161a and a second bandpass filter 161b.

The first bandpass filter 161a is disposed in the optical path of the yellow light YL, and the second bandpass filter 161b is disposed in the optical path of the green light GL0. The mover 162 includes a first mover 162a, which moves the first bandpass filter 161a, and a second mover 162b, which moves the second bandpass filter 161b. The first mover 162a and the second mover 162b are each formed, for example, of an actuator. The wavelength band converter 160 in the present embodiment controls the operation of driving the first mover 162a and the second mover 162b based, for example, on a signal inputted from the projector in accordance with the image display mode.

The first mover 162a moves the first bandpass filter 161a between the first position and the second position. When located in the first position, the first bandpass filter 161a is disposed in the optical path of the yellow light YL. When located in the second position, the first bandpass filter 161a is out of the optical path of the yellow light YL.

The second mover 162b moves the second bandpass filter 161b between the first position and the second position. When located in the first position, the second bandpass filter 161b is disposed in the optical path of the green light GL0. When located in the second position, the second bandpass filter 161b is out of the optical path of the green light GL0.

Figure 10:
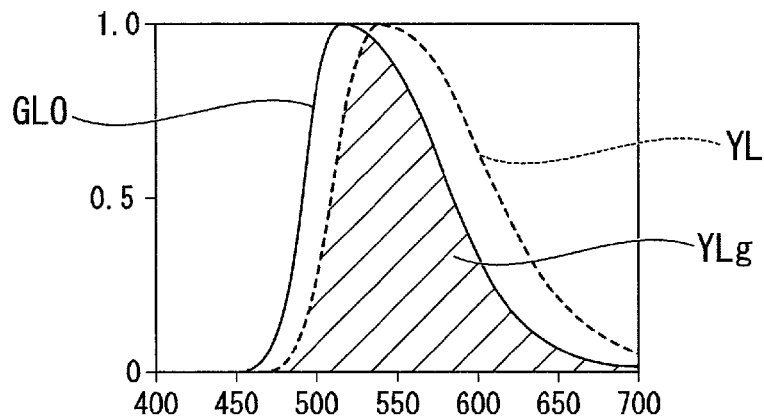
FIG. 10 shows the wavelength distributions of yellow light and green light.

FIG. 10 shows the wavelength distributions of the yellow light and the green light. In FIG. 10, the horizontal axis represents the wavelength, and the vertical axis represents the brightness (normalized value) of the light. The yellow light YL contains a green component YLg in a wavelength band that overlaps with the wavelength band to which the green light GL0 belongs as shown in FIG. 10.

Figure 11A:
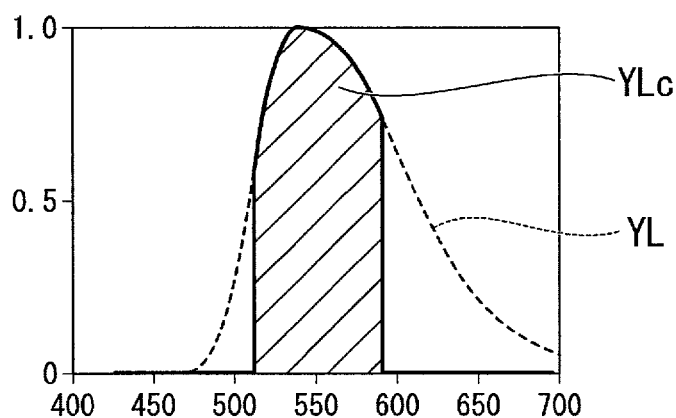
FIG. 11A shows optical characteristics of a first bandpass filter.
Figure 11B:
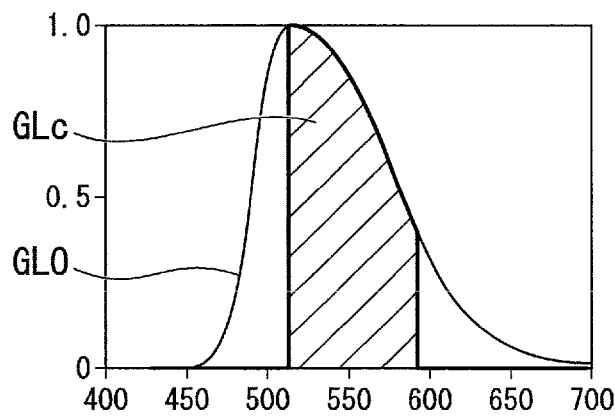
FIG. 11B shows optical characteristics of a second bandpass filter.

FIG. 11A shows optical characteristics of the first bandpass filter 161a, and FIG. 11B shows optical characteristics of the second bandpass filter 161b.

The first bandpass filter 161a selectively transmits a green component YLc, which belongs to a predetermined band (wavelength region from 520 to 590 nm, for example) out of the wavelength band contained in the yellow light YL and absorbs the components that belong to the other wavelength region, as shown in FIG. 11A. The first bandpass filter 161a can thus extract the high-color-purity green component YLc out of the components contained in the yellow light YL, and the thus extracted green component YLc can be used to display an image. The green component YLc is extracted when passing through the bandpass filter 161, which blocks the other components of the yellow light YL, and therefore has brightness lower than that of the yellow light YL.

The second bandpass filter 161b selectively transmits a green component GLc, which belongs to a predetermined band (wavelength region from 520 to 590 nm, for example) out of the wavelength band contained in the green light GL0 and absorbs the components that belong to the other wavelength region, as shown in FIG. 11B. The second bandpass filter 161b can thus extract the high-color-purity green component GLc out of the components contained in the green light GL0, and the thus extracted green component GLc can be used to display an image. The green component GLc is extracted when passing through the bandpass filter 161, which blocks the other components of the green light GL0, and therefore has brightness lower than that of the green light GL0.

The wavelength band converter 160 in the present embodiment achieves a state in which at least the first bandpass filter 161a is disposed in the optical path of the yellow light YL in accordance with the image display mode of the projector.

The wavelength band converter 160 in the present embodiment allows the high-color-purity green component YLc, although having lowered brightness, to be produced by placing the first bandpass filter 161a in the optical path of the yellow light YL. Further, the wavelength band converter 160 allows the yellow light YL to be extracted with no loss by retracting the first bandpass filter 161a from the optical path of the yellow light YL.

The wavelength band converter 160 in the present embodiment can therefore switch the position of the first bandpass filter 161a to the first position, where the first bandpass filter 161a is disposed in the optical path of the yellow light YL, to allow the light source apparatus 210 to output a light ray flux WA1 containing the red light RL, the green light component YLc, the green light GL0, and the blue light BL.

Further, the wavelength band converter 160 in the present embodiment can switch the position of the first bandpass filter 161a to the second position, to which the first bandpass filter 161a is retracted from the optical path of the yellow light YL, to allow the light source apparatus 210 to output the light ray flux WA1 containing the red light RL, the green light component YLc, the green light GL0, and the blue light BL.

The projector according to the present embodiment, in which the wavelength band converter 160 switches the position of the bandpass filter 161 to the second position, to which the bandpass filter 161 is retracted from the optical path of the yellow light YL, to allow the light source apparatus 210 to output light containing the red light RL, the yellow light YL, the green light GL0, and the blue light BL.

The green component contained in the light ray flux WA1 is formed of the high-color-purity green component YLc and the green light GL0. On the other hand, the green component contained in the illumination light outputted from the light source apparatus 210 when the position of the first bandpass filter 161a is switched to the second position contains the green component YLg contained in the yellow light YL shown in FIG. 10 and the green light GL0.

The light ray flux WA1 containing the green component YLc contains a high-color-purity green component although having lowered brightness as compared with the illumination light containing the green component YLg and the green light GL0. On the other hand, the illumination light containing the green component YLg and the green light GL0 contains the entire wavelength region of the yellow light YL and is therefore bright light although having color purity of the green component lower than that of the green component contained in the light ray flux WA1.

The projector according to the present embodiment, when the wavelength band converter 160 places the first bandpass filter 161a in the optical path of the yellow light YL, allows light having a high-color-purity green component to be incident on the light modulator. The projector according to the present embodiment can therefore display an image in the image display mode that allows improvement in the color gamut of the displayed image (color gamut priority image display mode).

Further, the projector 1 according to the present embodiment, when the wavelength band converter 160 retracts the first bandpass filter 161a from the optical path of the yellow light YL, allows the bright yellow light with no loss to be incident on the light modulator. The projector according to the present embodiment can therefore display an image in the image display mode in which priority is given to the brightness of the displayed image instead of the color gamut thereof (brightness priority image display mode).

The projector according to the present embodiment displays an image in some cases in an image display mode in which priority is given to the color gamut of the displayed image instead of the brightness thereof. When the image display mode in which the color gamut becomes broadest is selected in the projector according to the present embodiment, the wavelength band converter 160 further places the second bandpass filter 161b in the optical path of the green light GL0 with the first bandpass filter 161a placed in the optical path of the yellow light YL. The light source apparatus 210 can thus output light containing the red light RL, the green component YLc, the green component GLc, and the blue light BL. The green component GLc outputted from the light source apparatus 210 is high-color-purity light although having lowered brightness as compared with the green light GL0 contained in the light ray flux WA1.

The projector according to the present embodiment, when the wavelength band converter 160 places the first bandpass filter 161a in the optical path of the yellow light YL and the second bandpass filter 161b in the optical path of the green light GL0, allows higher-color purity green light to be incident on the light modulator. The projector according to the present embodiment can therefore display an image in an image display mode that allows improvement in the color gamut of the green portion of the displayed image although the displayed image has lowered brightness.

The present disclosure is not limited to the contents of the embodiments described above and can be changed as appropriate to the extent that the change does not depart from the substance of the present disclosure.

The projector according to each of the embodiments described above has been described with reference to the case where the wavelength band converter 60 or 160 moves the bandpass filter to switch the image display mode, but a viewer of an image projected by the projector may instead manually move the bandpass filter in accordance with the purpose of the projector.

In the first embodiment described above, the bandpass filter 61 is insertable into and retractable from the optical paths of the first green light GL1 and the second green light GL2, but the bandpass filter 61 may instead be fixed in the optical paths of the first green light GL1 and the second green light GL2. According to the configuration described above, an image having further improved color gamut of a green portion of the image can be always displayed even when fluorescence is used as the green light.

Similarly, in the second embodiment described above, the bandpass filter 161 may be fixed in the optical paths of the yellow light YL and the green light GL. According to the configuration described above, an image having further improved color gamut of a green portion of the image can be always displayed even when fluorescence is used as the yellow light and the green light.

In the second embodiment described above, the bandpass filter 161 is insertable into and retractable from the optical paths of the yellow light YL and the green light GL, but the bandpass filter 161 may instead be placed only in the optical path of the yellow light YL.

What is claimed is:

1. A projector comprising:
   a light source apparatus that includes a first light source unit output red light, a second light source unit output first fluorescence, a third light source unit output second fluorescence, and a fourth light source unit output blue light;
   a first bandpass filter provided in an optical path of the second light source unit;
   a second bandpass filter provided in an optical path of the third light source unit;
   an integrator unit on which a light ray flux containing the red light from the first light source, the first fluorescence from the second light source, the second fluorescence from the third light source, and the blue light from the fourth light source unit is incident, and which divides the light ray flux into a plurality of partial light ray fluxes;
   a superimposing lens that is provided on a downstream of the integrator unit and causes directions in which the plurality of partial light ray fluxes are incident on a light modulator to be different from one another;
   the light modulator including a plurality of pixels;
   a microlens array including a plurality of microlenses corresponding to the plurality of pixels; and
   a projection optical apparatus that projects light outputted from the light modulator;
   wherein:
      the first bandpass filter is moved between a first position disposed in the optical path of the second light source unit and a second position which is out of the optical path of the second light source unit to adjust a color purity of the first fluorescence, and
      the second bandpass filter is moved between a first position disposed in the optical path of the third light source unit and a second position which is out of the optical path of the third light source unit to adjust a color purity of the second fluorescence.

2. The projector according to claim 1, further comprising a first mover that switches a position of the first bandpass filter between the first position and the second position in accordance with an image display mode of the projector, and
   a second mover switches a position of the second bandpass filter between the first position and the second position in accordance with an image display mode of the projector.

3. The projector according to claim 1, wherein
the first fluorescence contains at least green light, and the second fluorescence contains at least green light.

4. The projector according to claim 1, wherein
the light source apparatus includes a first parallelizing system that parallelizes the first fluorescence, and a second parallelizing system that parallelizes the second fluorescence,
the first fluorescence parallelized by the first parallelizing system is incident on the first bandpass filter, and
the second fluorescence parallelized by the second parallelizing system is incident on the first bandpass filter.

5. The projector according to claim 1, wherein
the color purity of the first fluorescence that the first bandpass filter disposed in the first position is increased relative to the color purity of the first fluorescence that the first bandpass filter disposed in the second position, and
the color purity of the second fluorescence that the second bandpass filter disposed in the first position is increased relative to the color purity of the second fluorescence that the second bandpass filter disposed in the second position.

6. The projector according to claim 1, wherein
the first light source unit, the second light source unit, the third light source unit and the fourth light source unit are disposed in the same position in a direction along an axis of the projector, so that there is no difference in optical path length from each light source unit to the light modulator.

7. The projector according to claim 6, further comprising
a first mover that switches a position of the first bandpass filter between the first position and the second position in accordance with an image display mode of the projector, and
a second mover switches a position of the second bandpass filter between the first position and the second position in accordance with an image display mode of the projector.

8. The projector according to claim 6, wherein
the light source apparatus includes a first parallelizing system that parallelizes the first fluorescence, and a second parallelizing system that parallelizes the second fluorescence,
the first fluorescence parallelized by the first parallelizing system is incident on the first bandpass filter, and
the second fluorescence parallelized by the second parallelizing system is incident on the first bandpass filter.

9. The projector according to claim 6, wherein
the color purity of the first fluorescence that the first bandpass filter disposed in the first position is increased relative to the color purity of the first fluorescence that the first bandpass filter disposed in the second position, and
the color purity of the second fluorescence that the second bandpass filter disposed in the first position is increased relative to the color purity of the second fluorescence that the second bandpass filter disposed in the second position.

10. A projector comprising:
a light source apparatus that includes a first light source unit output red light, a second light source unit output first fluorescence, a third light source unit output second fluorescence, and a fourth light source unit output blue light;
a first bandpass filter provided in an optical path of the second light source unit;
a second bandpass filter provided in an optical path of the third light source unit;
an integrator unit on which a light ray flux containing the red light from the first light source, the first fluorescence from the second light source, the second fluorescence from the third light source, and the blue light from the fourth light source unit is incident, and which divides the light ray flux into a plurality of partial light ray fluxes;
a superimposing lens that is provided on a downstream of the integrator unit and causes directions in which the plurality of partial light ray fluxes are incident on a light modulator to be different from one another;
the light modulator including a plurality of pixels;
a microlens array including a plurality of microlenses corresponding to the plurality of pixels; and
a projection optical apparatus that projects light outputted from the light modulator;
wherein:
the first bandpass filter is moved between a first position disposed in the optical path of the second light source unit and a second position which is out of the optical path of the second light source unit to adjust a brightness of the first fluorescence, and
the second bandpass filter is moved between a first position disposed in the optical path of the third light source unit and a second position which is out of the optical path of the third light source unit to adjust a brightness of the second fluorescence.

11. The projector according to claim 10, further comprising
a first mover that switches a position of the first bandpass filter between the first position and the second position in accordance with an image display mode of the projector, and
a second mover switches a position of the second bandpass filter between the first position and the second position in accordance with an image display mode of the projector.

12. The projector according to claim 10, wherein
the light source apparatus includes a first parallelizing system that parallelizes the first fluorescence, and a second parallelizing system that parallelizes the second fluorescence,
the first fluorescence parallelized by the first parallelizing system is incident on the first bandpass filter, and
the second fluorescence parallelized by the second parallelizing system is incident on the first bandpass filter.

13. The projector according to claim 10, wherein
the brightness of the first fluorescence that the first bandpass filter disposed in the second position is increased relative to the brightness of the first fluorescence that the first bandpass filter disposed in the first position, and
the brightness of the second fluorescence that the second bandpass filter disposed in the second position is increased relative to the brightness of the second fluorescence that the second bandpass filter disposed in the first position.

14. The projector according to claim 10, wherein
the first light source unit, the second light source unit, the third light source unit and the fourth light source unit are disposed in the same position in a direction along an axis of the projector, so that there is no difference in optical path length from each light source unit to the light modulator.

15. A projector comprising:
a light source apparatus that includes a first light source unit output red light, a second light source unit output yellow fluorescence, a third light source unit output green fluorescence, and a fourth light source unit output blue light;
a first bandpass filter provided in an optical path of the second light source unit;
a second bandpass filter provided in an optical path of the third light source unit;
an integrator unit on which a light ray flux containing the red light from the first light source, the yellow fluorescence from the second light source, the green fluorescence from the third light source, and the blue light from the fourth light source unit is incident, and which divides the light ray flux into a plurality of partial light ray fluxes;
a superimposing lens that is provided on a downstream of the integrator unit and causes directions in which the plurality of partial light ray fluxes are incident on a light modulator to be different from one another;
the light modulator including a plurality of pixels;
a microlens array including a plurality of microlenses corresponding to the plurality of pixels; and
a projection optical apparatus that projects light outputted from the light modulator;
wherein:
the first bandpass filter is moved between a first position disposed in the optical path of the second light source unit and a second position which is out of the optical path of the second light source unit to adjust a color purity of the yellow fluorescence, and
the second bandpass filter is moved between a first position disposed in the optical path of the third light source unit and a second position which is out of the optical path of the third light source unit to adjust a color purity of the green fluorescence.

16. The projector according to claim 15, wherein
the first light source unit, the second light source unit, the third light source unit and the fourth light source unit are disposed in the same position in a direction along an axis of the projector, so that there is no difference in optical path length from each light source unit to the light modulator.

* * * * *